US012712152B2

(12) United States Patent
Voronin et al.

(10) Patent No.: US 12,712,152 B2
(45) Date of Patent: Aug. 18, 2026

(54) SYSTEM AND METHOD FOR PLASMA PROCESSING

(71) Applicant: Tokyo Electron Limited, Tokyo (JP)

(72) Inventors: Sergey Voronin, Albany, NY (US); Nicholas Smieszek, Albany, NY (US); Qi Wang, Albany, NY (US); Akiteru Ko, Albany, NY (US); Carl Smith, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 247 days.

(21) Appl. No.: 18/434,253

(22) Filed: Feb. 6, 2024

(65) Prior Publication Data

US 2025/0118532 A1 Apr. 10, 2025

Related U.S. Application Data

(60) Provisional application No. 63/588,979, filed on Oct. 9, 2023.

(51) Int. Cl.
*H01J 37/32* (2006.01)
*H10P 50/24* (2026.01)

(52) U.S. Cl.
CPC .. *H01J 37/32174* (2013.01); *H01J 37/32146* (2013.01); *H01J 37/32706* (2013.01); *H10P 50/242* (2026.01); *H01J 2237/0044* (2013.01); *H01J 2237/0473* (2013.01); *H01J 2237/3341* (2013.01)

(58) Field of Classification Search
CPC ........... H01J 37/32174; H01J 37/32146; H01J 37/32706; H01J 2237/0044; H01J 2237/0473; H01J 2237/3341; H01L 21/3065; H01L 21/31116; H10P 50/242
See application file for complete search history.

(56) References Cited

U.S. PATENT DOCUMENTS

| | | | | |
|---|---|---|---|---|
| 6,852,636 | B1 | 2/2005 | O'Donnell | |
| 11,189,496 | B2 | 11/2021 | Yin | |
| 2007/0193975 | A1* | 8/2007 | Wilson | H01J 37/32706 216/70 |
| 2012/0318456 | A1* | 12/2012 | Brouk | H01J 37/32935 315/111.21 |
| 2013/0092529 | A1 | 4/2013 | Singh | |
| 2015/0101634 | A1 | 4/2015 | Leavitt | |
| 2019/0122903 | A1* | 4/2019 | Shim | H01L 21/31116 |

(Continued)

FOREIGN PATENT DOCUMENTS

| | | | |
|---|---|---|---|
| CN | 1434978 | A | 8/2003 |
| KR | 20200096731 | A | 8/2020 |

OTHER PUBLICATIONS

Coburn, J.W. et al., "Positive-ion bombardment of substrates in rf diode glow discharge sputtering," J. Appl. Phys., vol. 43, No. 12, Dec. 1972, 8 pages, Published by the American Institute of Physics.

(Continued)

*Primary Examiner* — Anita K Alanko
(74) *Attorney, Agent, or Firm* — Slater Matsil, LLP

(57) ABSTRACT

A method for plasma processing includes biasing a substrate by ramping a sheath voltage during a first phase of a plasma process and removing sidewall charge buildup on a feature of the substrate in an absence of substrate biasing during a second phase of the plasma process.

19 Claims, 14 Drawing Sheets

(56) References Cited

U.S. PATENT DOCUMENTS

| | | | | |
|---|---|---|---|---|
| 2020/0251345 | A1* | 8/2020 | Yin | H01L 21/31116 |
| 2021/0066040 | A1* | 3/2021 | Kubota | H01J 37/32532 |
| 2021/0134562 | A1 | 5/2021 | Fairbairn | |
| 2022/0367157 | A1* | 11/2022 | Cui | H01J 37/32715 |
| 2023/0130829 | A1* | 4/2023 | Dhindsa | H01L 21/6831 315/111.21 |
| 2025/0226179 | A1* | 7/2025 | Chen | H01J 37/32174 |

OTHER PUBLICATIONS

Czarnetzki, U. et al., “The electrical asymmetry effect in capacitively coupled radio-frequency discharges,” Plasma Sources Sci. Technol., 20, Apr. 1, 2011, 16 pages, IOP Publishing.

Faraz, T. et al., “Precise ion energy control with tailored waveform biasing for atomic scale processing,” Journal of Applied Physics, 128, Dec. 7, 2020, 10 pages, AIP Publishing.

Huang, S. et al., “Plasma etching of high aspect ratio features in SiO2 using Ar/C4F8/O2 mixures: A computational investigation,” J. Vac. Sci. Technol. A, 37 (3), Apr. 17, 2019, 27 pages, Published by the AVS.

Kruger, F. et al., “Voltage waveform tailoring in radio frequency plasmas for surface charge neutralization inside etch trenches,” Plasma Sources Sci. Technol., 28, Jul. 31, 2019, 14 pages, IOP Publishing.

Kurihara, K. et al., “Fabrication of Capillary Plate with Sub-Micron Holes for Investigating High-Aspect-Ratio Etching Characteristics,” Japanese Journal of Applied Physics, vol. 39., Part 1, No. 3A, Mar. 2000, 3 pages.

Kurihara, K. et al., “Plasma characteristics observed through high-aspect-ratio holes in C4F8 plasma,” Plasma Sources Sci. Technol., 5 (2), May 1996, 6 pages, IOP Publishing Ltd.

Matsui, J. et al., “Effect of aspect ratio on topographic dependent charging in oxide etching,” J. Phys. D: Appl. Phys., 34, Sep. 18, 2001, 7 pages, Institute of Physics Publishing.

Ohiwa, T. et al., “Mechanism of Etch Stop in High Aspect-Ratio Contact Hole Etching,” Japanese Journal of Applied Physics, vol. 37, Part 1, No. 9A, Sep. 1998, 5 pages.

International Searching Authority, “Notification of Transmittal of the International Search Report and the Written Opinion of the International Searching Authority, or the Declaration,” Date of mailing Dec. 3, 2024, International application No. PCT/US2024/042476, 11 pages.

* cited by examiner

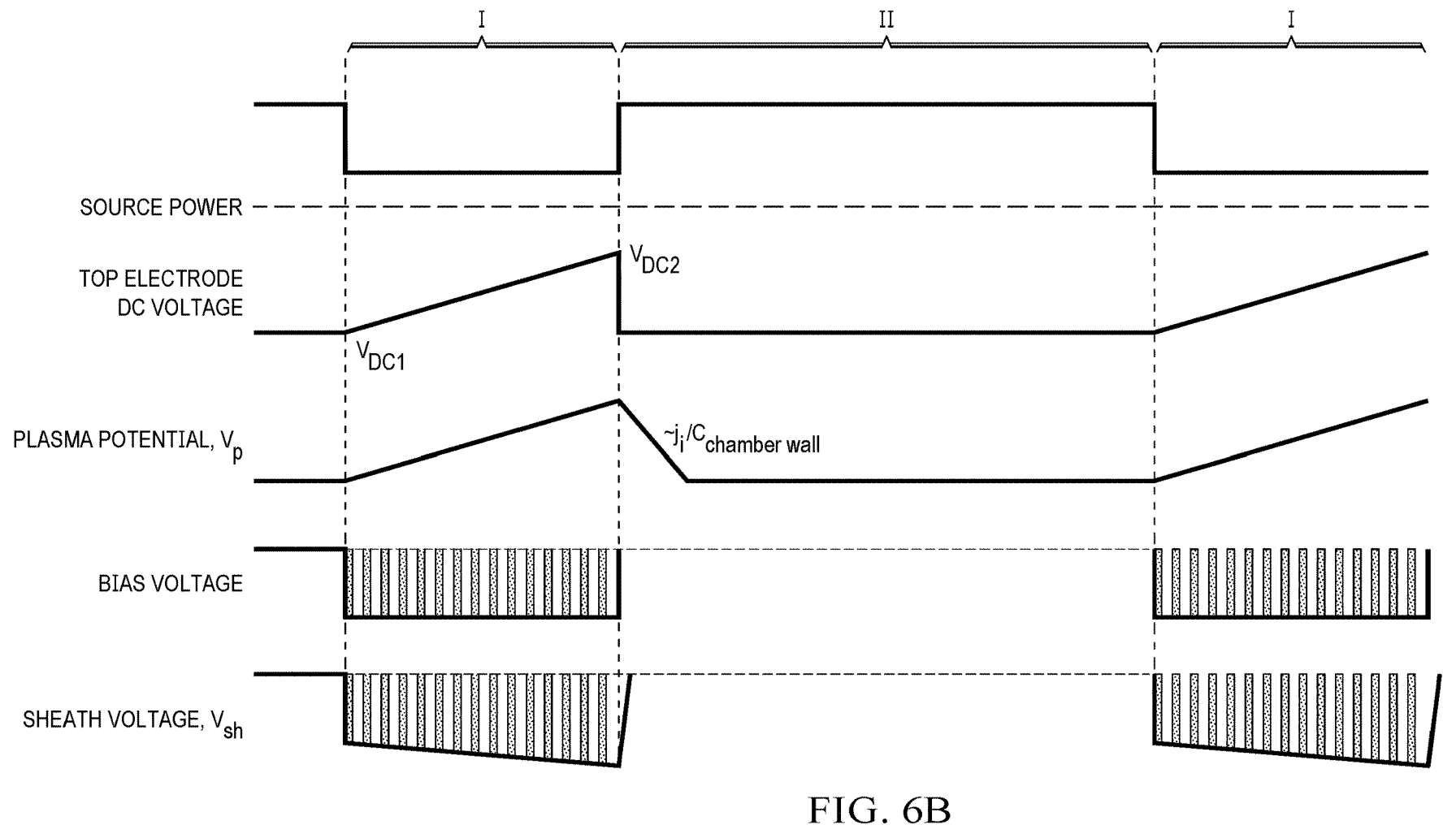

I

II

I

SOURCE POWER

TOP ELECTRODE DC VOLTAGE $V_{DC1}$ $V_{DC2}$

PLASMA POTENTIAL, $V_p$ $\sim j_i/C_{chamber\ wall}$

BIAS VOLTAGE

SHEATH VOLTAGE, $V_{sh}$

FIG. 6B

SYSTEM AND METHOD FOR PLASMA PROCESSING

CROSS-REFERENCE TO RELATED APPLICATIONS

This application claims the benefit of U.S. Provisional Application No. 63/588,979, filed on Oct. 9, 2023, which application is hereby incorporated herein by reference.

TECHNICAL FIELD

The present invention relates generally to the field of semiconductor manufacturing and semiconductor devices, and, in particular embodiments, to a system and method for plasma processing.

BACKGROUND

Device formation within microelectronic workpieces can involve a series of manufacturing techniques including formation, patterning, and removal of a number of layers of material on a substrate. In order to achieve the physical and electrical specifications of current and next generation semiconductor devices, processing flows enabling reduction of feature size while maintaining structural integrity is desirable for various patterning processes. As device structures densify and develop vertically, the desire for precision material processing becomes more compelling.

Plasma processes are commonly used to form devices, interconnects, and contacts in microelectronic workpieces. For example, plasma etching and plasma deposition are common process steps during semiconductor device fabrication. A combination of source power (SP) applied to a coupling element and bias power (BP) applied to a substrate holder can be used to generate and direct charged species from plasma. Various conditions during a plasma process may influence interactions of plasma ions with substrates and resulting effectiveness of etching.

SUMMARY

In accordance with an embodiment, a method for plasma processing includes: biasing a substrate by ramping a sheath voltage during a first phase of a plasma process; and removing sidewall charge buildup on a feature of the substrate in an absence of substrate biasing during a second phase of the plasma process.

In accordance with another embodiment, a method for plasma processing includes: bombarding a feature of a substrate with ions from a first plasma generated with a first source power cycle from a power source, the ions being accelerated towards the substrate by ramping up a DC voltage provided to a boundary electrode above the substrate; reducing the DC voltage provided to the boundary electrode to lower the acceleration of the ions towards the substrate; and applying a second source power cycle from the power source to generate a second plasma and exposing the substrate to the second plasma to remove sidewall charge on a feature of the substrate, the second source power cycle being greater than the first source power cycle.

In accordance with yet another embodiment, a method for an etch process includes: providing a substrate into a plasma processing chamber; generating a plasma in the plasma processing chamber; etching a feature of the substrate with energetic reactive ions by providing an accelerating sheath voltage with a ramping amplitude; and discharging the feature of the substrate with a source power cycle provided to the plasma processing chamber.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which:

FIGS. 6A and 6B illustrate another system and method for plasma processing, in accordance with some embodiments;

Figure 1:
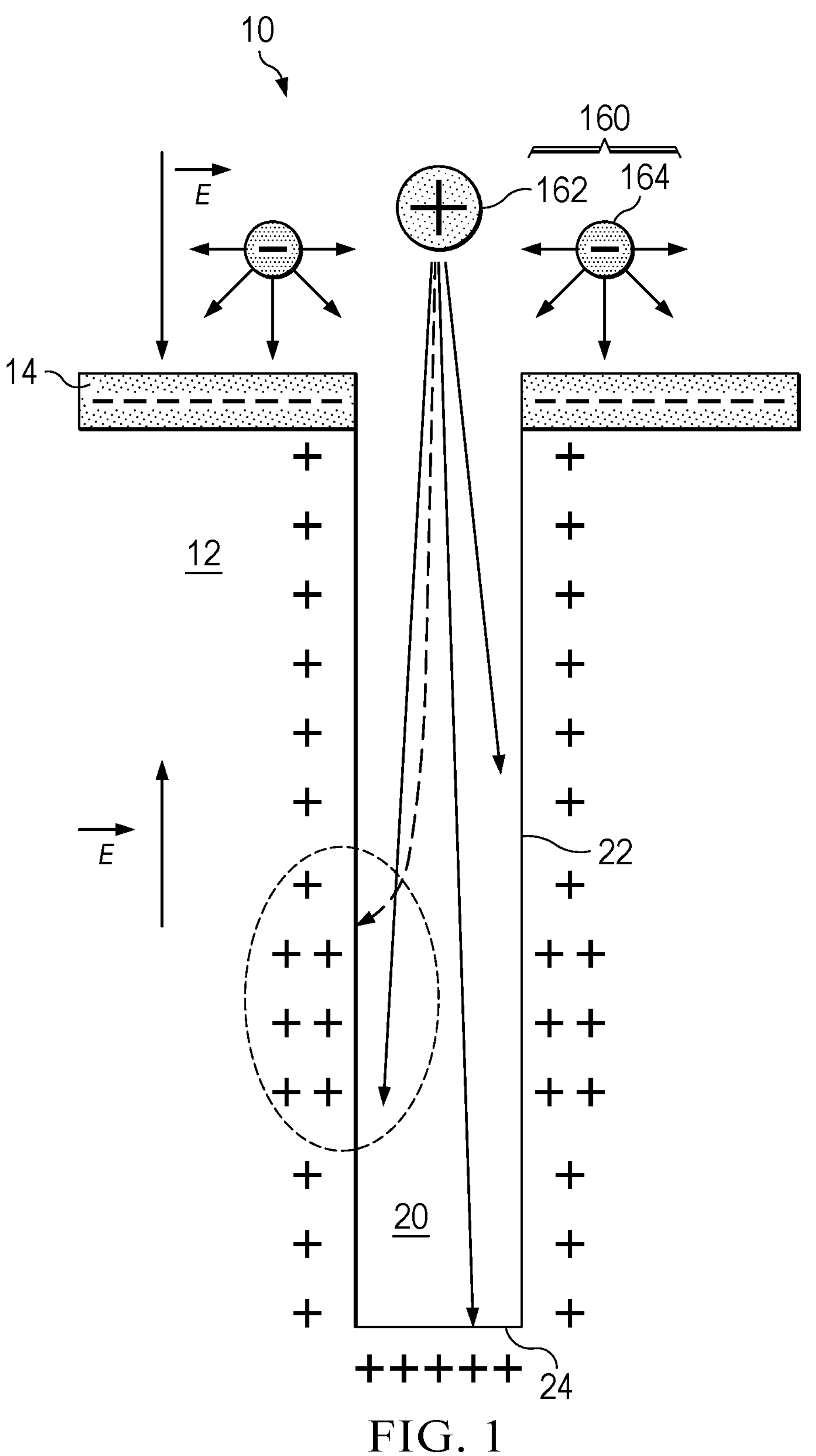
FIG. 1 illustrates an example of a semiconductor structure during a plasma process.

Corresponding numerals and symbols in the different Figures generally refer to corresponding parts unless otherwise indicated. The Figures are drawn to clearly illustrate the relevant aspects of the embodiments and are not necessarily drawn to scale. The edges of features drawn in the Figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments. The references used herein are provided merely for convenience and hence do not define the extent of protection or the scope of the embodiments.

Both source power (SP) and bias power (BP) may be supplied as radio frequency (RF) power to the processing chamber of a plasma processing apparatus. Cyclic plasma processing methods supply one or both of the RF source power and RF bias power to a processing chamber as pulses rather than as continuous wave power. For example, BP pulses may be provided synchronously or asynchronously with SP pulses. Such existing synchronous/asynchronous schemes often use a single RF frequency for the bias power, even when supplying the bias power asynchronously (e.g., single frequency, dual-phase), and may not be adequate to independently control etching and deposition. Some conventional methods mix RF frequencies, RF sinusoidal waveform signals, and/or rectangular waveforms (e.g., pulsed DC voltage) to shape the waveform of the BP pulses, but such methods are employed to influence plasma uniformity and do not afford independent control over deposition and etching.

The continuous shrinkage of critical dimensions, introduction of new materials, and increase of integration complexity in semiconductor technology imposes stringent requirements on plasma processing techniques. Control of the transport of reactive ions and neutral species for surface interaction remains a vexing challenge in the industry and requires novel methods for further process improvement. Etching dielectric materials brings additional difficulties related to net charge accumulation due to differences in isotropy and mobility between positive ions and negative electrons in a plasma discharge.

To address these challenges, disclosed herein is an etch process comprising a step of substrate bias potential (and sheath voltage) ramping and a step for feature wall charge build up neutralization. The step of bias voltage ramping is performed on a millisecond to second timescale to minimize ions repelled by electric fields induced by accumulated charge on high aspect ratio (HAR) feature sidewalls. The step of charge neutralization is then performed to neutralize the net accumulated charge on the high aspect ratio feature sidewalls. This step may be performed with little or no biasing voltage applied to the substrate. The substrate biasing (with ramping sheath voltage) and charge neutralization steps are repeated until the high aspect ratio feature etching is completed substantially without defects due to charge accumulation effects. Additionally, this etch process sequence may be applied during a particular time period of an etch process and conventional plasma processes and procedures may be used for the remainder of the etch process time. As an example, 70% of a targeted depth may be etched using a continuous wave source power and continuous wave or pulsing bias power, and the remainder of the targeted depth may be etched using the etch process comprising the step of substrate biasing (with ramping sheath voltage) ramping and the step for charge build up neutralization. This may be advantageous for increasing etching efficiency when aspect ratios of an etched feature become high.

According to one or more embodiments of the present disclosure, this application relates to methods for enhancing ion transport in dielectric features. The methods provide effective etching and minimizes defects (twisting, bowing, notching, trenching, or the like) that may be associated with net charge accumulation on the dielectric sidewalls of a high aspect ratio feature.

Embodiments of the disclosure are described in the context of the accompanying drawings. An example of a semiconductor structure with dielectric non-conductive walls during a plasma process will be described using FIG. 1 and its electrical model will be described using FIG. 2. An example non-monoenergetic ion energy distribution will be described using FIG. 2B. One example of "artificial" bias voltage to generate a bi-peak ion energy distribution will be described using FIG. 3A. Experimental results of continuous increasing of accelerating sheath voltage (ion energy) on net charge accumulation will be described using FIG. 3B. Embodiments of plasma processing systems will be described using FIGS. 4A-4B. Embodiments of a system and method for plasma processing will be described using FIGS. 5A-5B. Embodiments of another system and method for plasma processing will be described using FIGS. 6A-6B. An embodiment of a method for processing a substrate will be described using FIGS. 7A-7D. Embodiments of methods for plasma processing will be described using FIGS. 8 and 9. An embodiment of a method for an etch process will be described using FIG. 10.

FIG. 1 illustrates a cross-sectional view of a semiconductor structure 10 (e.g., a semiconductor substrate such as a wafer) during a plasma process (e.g., an etch process for a high aspect ratio feature) in order to illustrate net charge accumulation. An opening 20 (e.g., a hole for a small via, a trench, or the like, such as a high aspect ratio feature) extends through a top surface 14 (also referred to as a flat surface) of the semiconductor structure 10 into a bulk layer 12 of the semiconductor structure 10. In various embodiments, the bulk layer 12 comprises a dielectric material such as silicon oxide or silicon dioxide. However, any suitable dielectric material may be used for the bulk layer 12. In an example, the bulk layer 12 comprises a conductive material that is coated by a dielectric film from a plasma (e.g., a carbon fluoride (CF) film or the like). The semiconductor structure 10 is exposed to a plasma 160 that comprises positive ions 162 and electrons 164. Negative ions may be present in the plasma, but this disclosure considers the majority of highly mobile electrons 164 and positive ions 162. The semiconductor structure 10 may receive a negative bias voltage so that the top surface 14 of the semiconductor structure 10 (also referred to as an electrode surface) has negative charge to attract the positive ions 162. In general, the flat surface of the semiconductor structure 10 receives a negative build up net charge due to a difference in mobility between the highly mobile highly mobile electrons 164 and heavy positive ions 162 from the plasma 160.

An electron-shading effect may be produced by the difference in isotropy and mobility of positive ions 162 and electrons 164. Due to the electric field E pointing towards the top surface 14, the positive ions 162 may be accelerated into the sheath toward the top surface 14. This may result in a highly anisotropic angular distribution and transport inside the opening 20. Net positive charges may accumulate over time on sidewalls 22 and bottom surfaces 24 inside high aspect ratio etched features such as the opening 20. This net positive charge accumulation may induce a repelling electric field that may subsequently deflect or repel incoming positive ions 162. This can include positive ions 162 with relatively narrow ion angular distributions, and particularly positive ions 162 with relatively low energies.

Figure 2A:
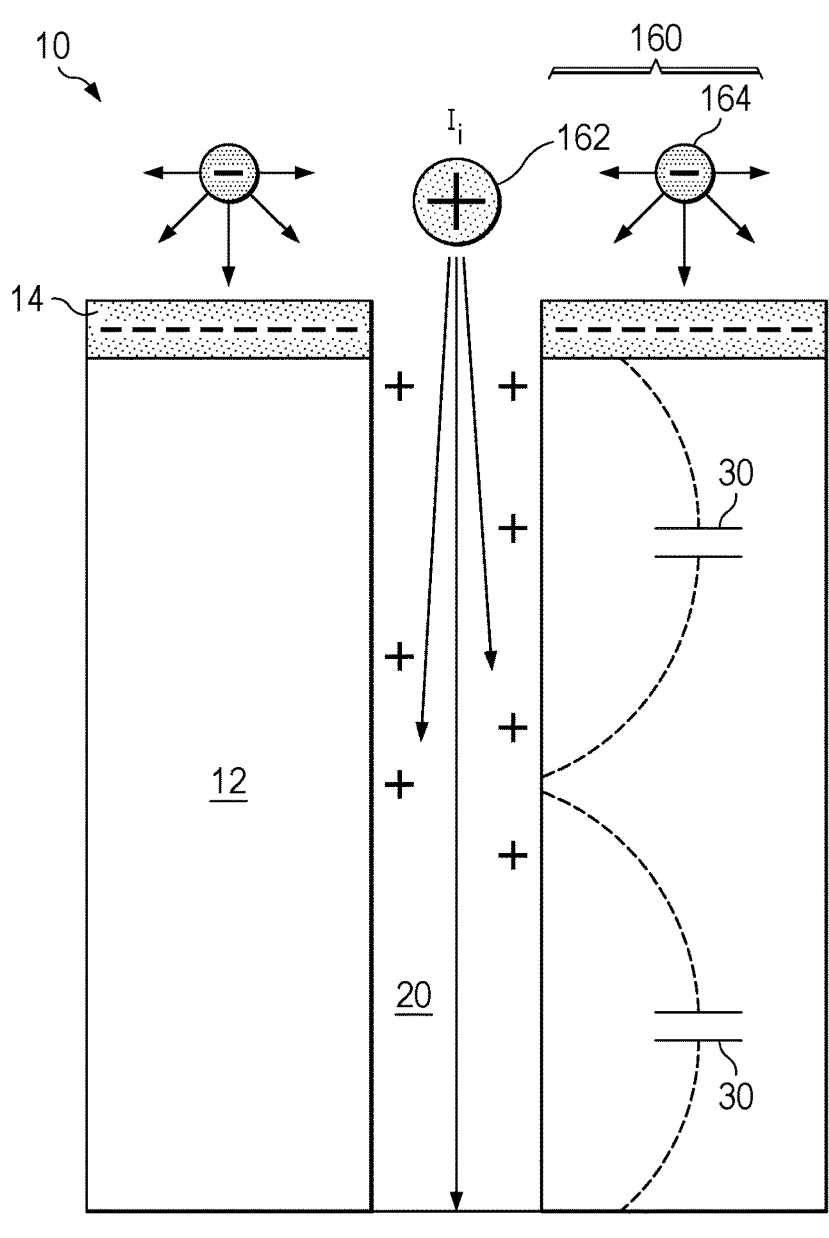
FIG. 2A illustrates an example of a semiconductor structure with sidewall capacitance.

FIG. 2A illustrates a cross-sectional view of the semiconductor structure 10 (also referred to as a via structure) representing the capacitance of its dielectric sidewalls as a capacitor 30 or set of capacitors 30. It has been estimated and may be in agreement with experimental data that an ion current $I_i$ comprising positive ions 162 entering from the plasma 160 into an opening 20 (e.g., a small via hole) may cause extremely slow sidewall surface voltage change rates, such as change rates of a few volts per millisecond. The time scales associated with sidewall charging (in other words, charging of the set of capacitors 30 representing sidewall capacitance) may thus be many orders of magnitude longer than a typical RF cycle (e.g., $10^{-7}$ seconds to $10^{-5}$ seconds) or a plasma pulse modulation cycle (e.g., $10^{-5}$ seconds to $10^{-1}$ second) and can extend up to tens of seconds.

Figure 2B:
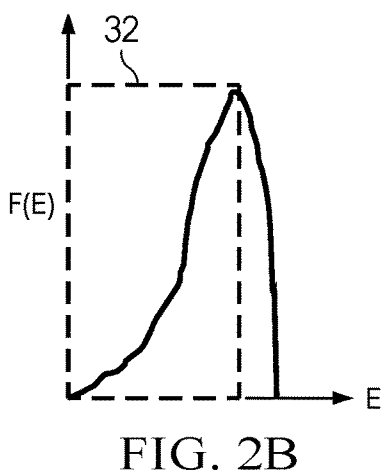
FIG. 2B illustrates an example non-monoenergetic ion energy distribution.

FIG. 2B illustrates an example non-monoenergetic ion energy distribution (IED). When the ion energy distribution (IED) of a plasma 160 is non-monoenergetic, ions with lower energies are likely to be repelled or deflected in the opening 20 by the electric field induced by net charge created by ions of the highest energies. This may cut off the lower energy portion 32 of the ion energy distribution function (IEDF), so that ions in the lower energy portion 32 of the ion energy distribution function are repelled or deflected in the opening 20 by the accumulated net charge. This may be disadvantageous by resulting in, for example, defects and less efficient etching of the targeted material in the case of etch processes.

In order to reduce or eliminate this effect, a process with a continuous increase of ion energy (also referred to as ramping) during a process pulse, cycle, or step can be used. If each group of ions arrives with higher energies compared to the previous groups, the ions are more likely to pass the repelling electrical field induced by the net charge accumulated on the sidewall 22 (see above, FIG. 1). This may allow the etch process to continue for a longer time without formation of defects than may occur in processes when ion energies are kept substantially constant during a process pulse, cycle, or step.

Figure 3A:
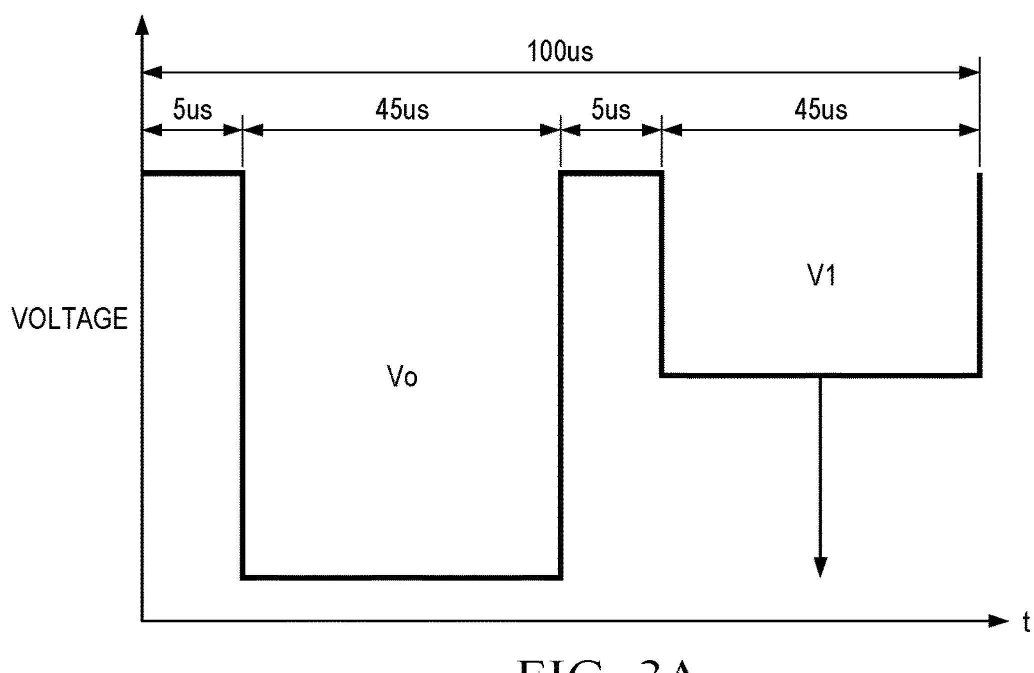
FIG. 3A illustrates a graph of bias voltage waveforms.

FIG. 3A illustrates a graph of bias voltage waveforms for experiments to test the effects of the continuous increasing of ion energy on net charge accumulation, in accordance with some embodiments. An array of openings (also referred to as a via array) exposed to a plasma was biased by non-tailored or tailored voltage waveforms while the ion current (in other words, the ion flux) was detected at the exit of the array of openings (also referred to as the via exit) by a negatively biased electrode. FIG. 3A illustrates a first bias sequence that includes two short DC pulses with constant voltages performed with a pulse frequency of 10 kHz (in other words with a period of about 100 μs). The first pulse was provided at a voltage $V_0$ of 100 V to provide high energy ions. The second pulse (also referred to as a "test pulse") was produced with a voltage $V_1$ less than $V_0$ (such as in a range of 0 V to 100 V) and was used to replicate the low-energy portion of an ion energy distribution function (e.g., lower energy portion 32; see above, FIG. 2B). The second pulse was used for time-resolved ion current measurements of lower energy ions, as described below with respect to FIG. 3B. Each of the first pulse and second pulse had a duration of about 45 μs and were separated by about 5 μs. A second bias sequence was performed in which both first pulse and second pulse voltages were increased at a slew rate of 0.5 V/ms (also referred to as ramping) during the respective pulses (see below, FIG. 3B).

Figure 3B:
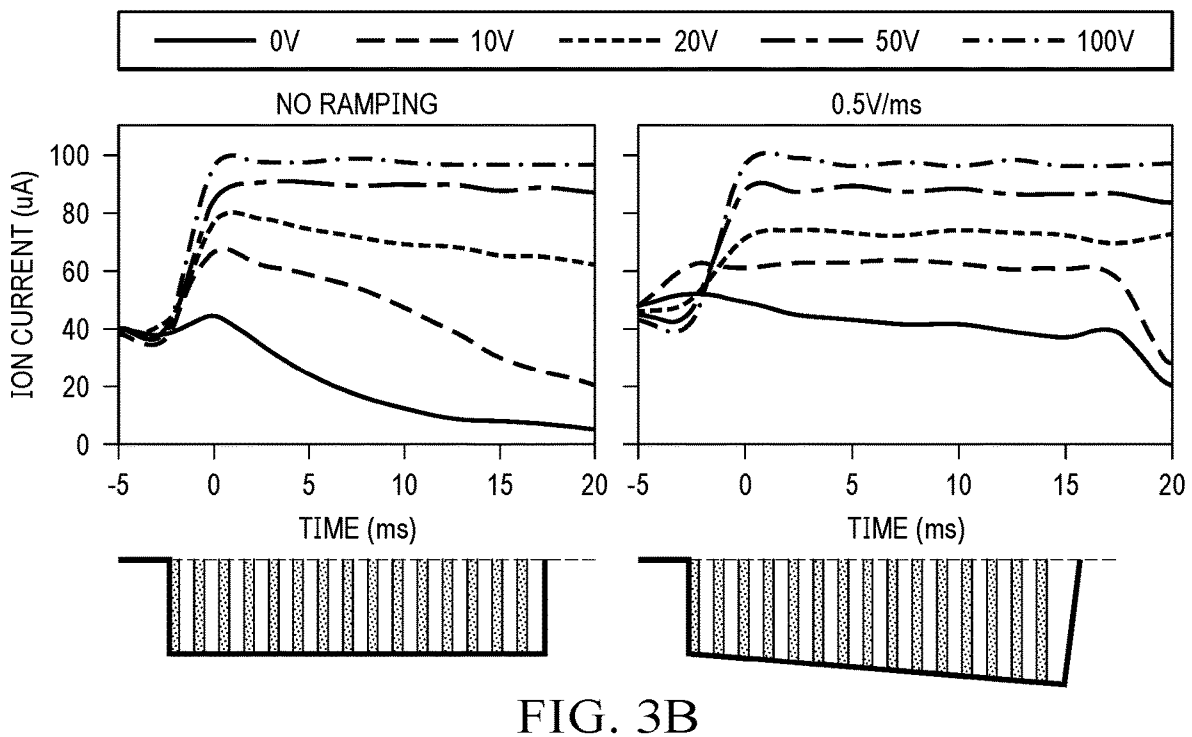
FIG. 3B illustrates experimental results of continuous increasing of accelerating sheath voltage (ion energy) on net charge accumulation, in accordance with some embodiments.

FIG. 3B illustrates experimental results of testing the effects of the continuous increasing of accelerating sheath voltage (ion energy) on net charge accumulation, in accordance with some embodiments. Without tailored voltage waveform application (illustrated on the left side of FIG. 3B and labelled as "No Ramping" with a flat pulse), while the ion current remains nearly constant throughout the pulse for high energy ions (such as ions produced with 100 V and 50 V pulses), the low energy ions (such as ions produced with 0 V, 10 V, and 20 V pulses) demonstrate a significant current decrease during the pulse. However, when the voltage magnitudes of both pulses are increased at a slew rate as low as 0.5 V/ms (illustrated on the right side of FIG. 3B and labelled as "0.5 V/ms" with a slewed pulse), ion currents remain largely constant during each pulse for all ion energy distribution function (IEDF) energy bands. This behavior of ion current, particularly the low energy ion current, may provide significant benefits for increasing etch efficiency and reducing defects.

Figure 4A:
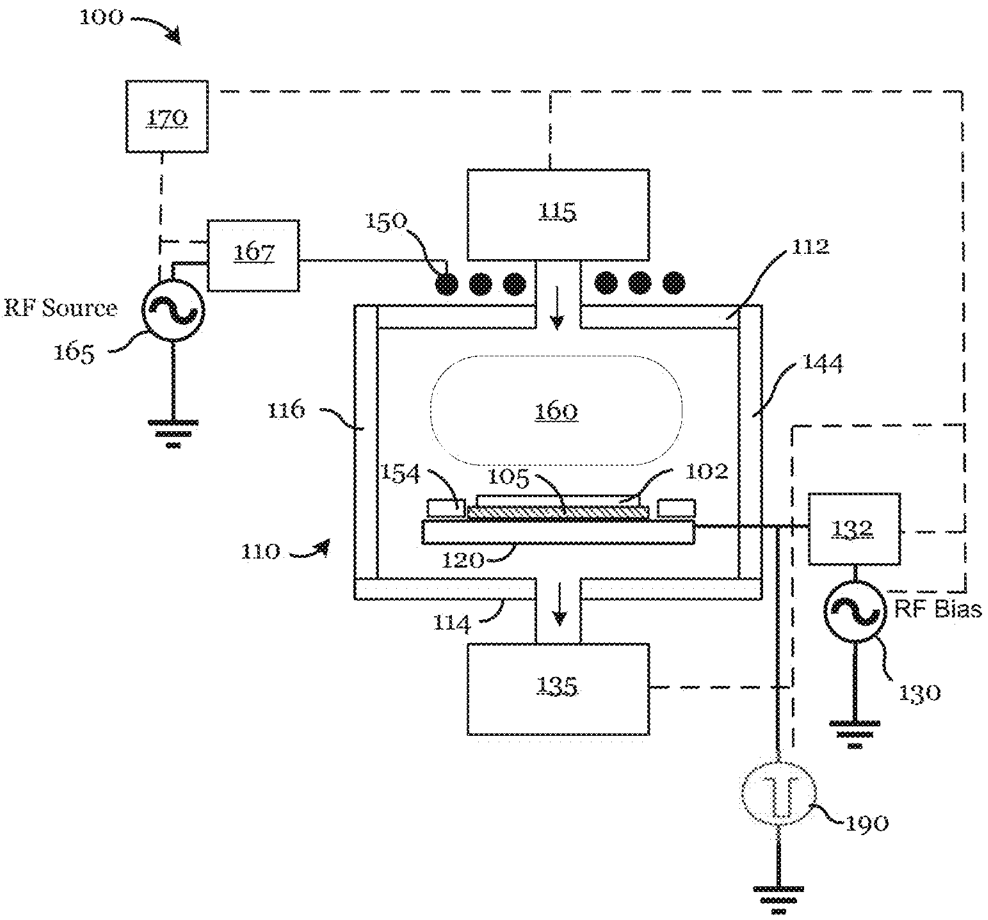
FIG. 4A illustrates an example plasma processing system, in accordance with some embodiments.

FIG. 4A illustrates an example plasma processing system 100 used for inductively coupled plasma (ICP), in accordance with some embodiments. As illustrated in FIG. 4A, the plasma processing system 100 comprises a plasma processing chamber 110 with source power excitation and substrate bias power (in other words, wafer biasing capabilities). The plasma processing chamber 110 comprises a top plate 112, a bottom plate 114, and a side wall 116. The top plate 112, bottom plate 114, and side wall 116 may be conductive and electrically connected to the system ground (a reference potential).

Further in FIG. 4A, an antenna 150 is located outside the plasma processing chamber 110, positioned above a top plate 112. In various embodiments, the antenna 150 is a conductive helical coil electrode used to inductively ignite and couple power to a plasma 160 inside the plasma processing chamber 110. However, any suitable antenna 150 may be used. The antenna 150 may be coupled to a radio frequency (RF) source 165 via a matching circuit 167.

The matching circuit 167 typically includes one or more capacitors and inductors. In embodiments, the capacitors and inductors may be variable. The forward and reflected power at the matching circuit 167 can be measured, and the matching circuit 167 is used to match the plasma impedance. For example, a feedback loop circuit may be used to adjust the variable capacitors and inductors.

A substrate 102 may be placed on a substrate holder 105 in the plasma processing chamber 110. In various embodiments, the substrate 102 may be a part of, or including, a semiconductor device, and may have undergone a number of steps of processing following, for example, a conventional process. The substrate 102 accordingly may comprise layers of semiconductors useful in various microelectronics. For example, the semiconductor structure may comprise the substrate 102 in which various device regions are formed.

In one or more embodiments, the substrate 102 may be a silicon wafer or a silicon-on-insulator (SOI) wafer. In certain embodiments, the substrate 102 may comprise a silicon germanium wafer, silicon carbide wafer, gallium arsenide wafer, gallium nitride wafer or other compound semiconductor. In other embodiments, the substrate 102 comprises heterogeneous layers such as silicon germanium on silicon, gallium nitride on silicon, silicon carbon on silicon, or layers of silicon on a silicon or SOI substrate. In various embodiments, the substrate 102 is patterned or embedded in other components of the semiconductor device.

In various embodiments, the plasma processing system 100 may further comprise a focus ring 154 positioned over a bottom electrode 120 to surround the substrate 102. The focus ring 154 may advantageously maintain and extend the uniformity of a plasma 160 to achieve process consistency at the edge of the substrate 102. In various embodiments, the focus ring 154 may have a width of a few centimeters. In various embodiments, there may be a gap for mechanical clearance between the circumference of the substrate 102 and the focus ring 154. In certain embodiments, the gap may be hundreds of microns to a few millimeters. In various embodiments, the focus ring 154 comprises a dielectric material with a desired dielectric constant. In certain embodiments, the focus ring 154 comprises silicon. Some examples of silicon-based focus ring comprise silicon, silicon oxide, doped silicon (e.g., boron-doped, nitrogen-doped, and phosphorous-doped), or silicon carbide. Alternatively, in some embodiments, the focus ring comprises a carbon-based material. In one or more embodiments, the focus ring 154 may comprise a metal oxide, such as aluminum oxide and zirconium oxide.

A process gas is introduced into the plasma processing chamber 110 by a gas delivery system 115. The gas delivery system 115 may comprise multiple gas flow controllers to control the flow of multiple gases into the plasma processing chamber 110. Any precursors that can create a plasma may be used, such as argon (Ar), tetrafluoromethane ($CF_4$), oxygen ($O_2$), an admixture of tetrafluoromethane and oxygen ($CF_4/O_2$), chlorine ($Cl_2$), fluoromethane ($CH_3F$), trifluoromethane ($CHF_3$), difluoromethane ($CH_2F_2$), hexafluorobutadiene ($C_4F_6$), octafluorocyclobutane ($C_4F_8$), nitrogen ($N_2$), hydrogen ($H_2$), hydrogen bromide (HBr), the like, or any combination, or admixture thereof in any suitable ratio. In some embodiments, optional center/edge splitters may be used to independently adjust the gas flow rates at the center and edge of the substrate 102. In various embodiments, the total flow rate of the gas is in a range of 1 standard cubic centimeters per minute (sccm) to 5000 sccm, at a pressure in a range of 0.1 mTorr to 1 Torr, and/or at a temperature in a range of −200° C. to 500° C.

The gas delivery system 115 may have a showerhead configuration positioned at the top of the plasma processing chamber 110 covering the entirety of the substrate 102, including a plurality of appropriately spaced gas inlets. Alternatively, gas may be introduced through dedicated gas inlets of any other suitable configuration. The plasma processing chamber 110 may further be equipped with one or more sensors such as voltage-current sensors, pressure monitors, gas flow monitors, and/or gas species density monitors. The sensors may be integrated as a part of the gas delivery system 115 in various embodiments.

In FIG. 4A, the plasma processing chamber 110 is a vacuum chamber and may be evacuated using one or more vacuum pumps 135, such as a single stage pumping system or a multistage pumping system (e.g. a mechanical roughing pump combined with one or more turbomolecular pumps). In order to promote even gas flow during plasma processing, gas may be removed from more than one gas outlet or location in the plasma processing chamber 110 (e.g., on opposite sides of the substrate 102).

In various embodiments, the substrate holder 105 may be integrated with, or a part of, a chuck (e.g., a circular electrostatic chuck (ESC)) positioned near the bottom of the plasma processing chamber 110, and connected to a bottom electrode 120. The surface of the chuck or the substrate holder 105 may be coated with a conductive material (e.g., a carbon-based or metal-nitride based coating). The substrate 102 may be optionally maintained at a desired temperature using a temperature sensor and a heating element connected to a temperature controller (not shown). In certain embodiments, the temperature sensor may comprise a thermocouple, a resistance temperature detector (RTD), a thermistor, or a semiconductor based integrated circuit. The heating element may for example comprise a resistive heater in one embodiment. In addition, there may be a cooling element such as a liquid cooling system coupled to the temperature controller.

The bottom electrode 120 may be coupled to a RF bias source 130, such as through a matching circuit 132, and/or to a pulse DC power source 190. The matching circuit 132 may comprise similar components in similar configurations as described above for the matching circuit 167, and the details are not repeated herein. In some embodiments, the RF bias source 130 provides a sinusoidal waveform and the pulse DC power source 190 provides a rectangular or sawtooth DC voltage to the bottom electrode 120.

The plasma processing system 100 further comprises a controller 170 to control plasma processing and adjust parameters in real time. In some embodiments, the controller 170 is a programmable processor, microprocessor, computer, or the like. Although the controller 170 is illustrated as a single element for illustrative purposes, the controller 170 may include additional elements or be part of a single element. The controller 170 may be programmable by instructions stored in software, firmware, hardware, or a combination thereof. The controller 170 may be coupled to the RF source 165, the matching circuit 167, the RF bias source 130, the pulse DC power source 190, the matching circuit 132, the gas delivery system 115, and/or the one or more vacuum pump(s) 135. The controller 170 may be configured to set, monitor, and/or control various control parameters associated with generating a plasma and delivering ions to the surface of a microelectronic workpiece (e.g., a substrate 102 such as a semiconductor wafer). Control parameters may include, but are not limited to, power level, frequency, and duty cycle (%) for the source power, the bias power, and the DC voltage. Other control parameter sets may also be used.

In various embodiments, the controller 170 is programmed to monitor and control different phases or steps of an etch cycle, such as performing a step of etching a feature (e.g., an opening such as a high aspect ratio hole or trench) of the substrate 102 and a step of neutralizing excessive charge on the feature (e.g., excessive via sidewall charge). The etching step may be performed by, for example, ramping a bias voltage applied to the substrate holder 105 from the RF bias source 130. The neutralizing step may be performed, for example, by decreasing the bias voltage or sheath voltage and performing a source power pulse (also referred to as a source power cycle or source power period). The controller 170 may be programmed to perform the etching and neutralizing steps for any suitable number of cycles during a plasma process.

In some embodiments, the excitation frequency range for the RF source power is in a range of 100 kHz to 5 GHz, such as 1 MHz to 5 GHz, and when operated in a pulsing mode the modulation frequency is in a range of 0.01 Hz to 10 kHz. While only one RF power source is illustrated in FIG. 4A, more than one RF power source(s) may be used in various embodiments, for example, to provide a low frequency RF power and a high frequency RF power at the same time.

In some embodiments, the operating frequency range for the RF bias power is 10 kHz to 40 MHz. However, any suitable frequency range may be used. In some embodiments, the modulation frequency range for the DC pulse power is 10 kHz to 10 MHz with a DC pulse duty cycle in a range of 5% to 90%. While only one RF bias source 130 and one pulse DC power source 190 are illustrated in FIG.

4A, more than one RF bias source(s), more than one pulse DC power source(s), or a combination of both may be used in various embodiments, for example, to provide a low frequency bias RF power and a high frequency bias RF power at the same time and enable changing the bias RF frequency more rapidly.

Figure 4B:
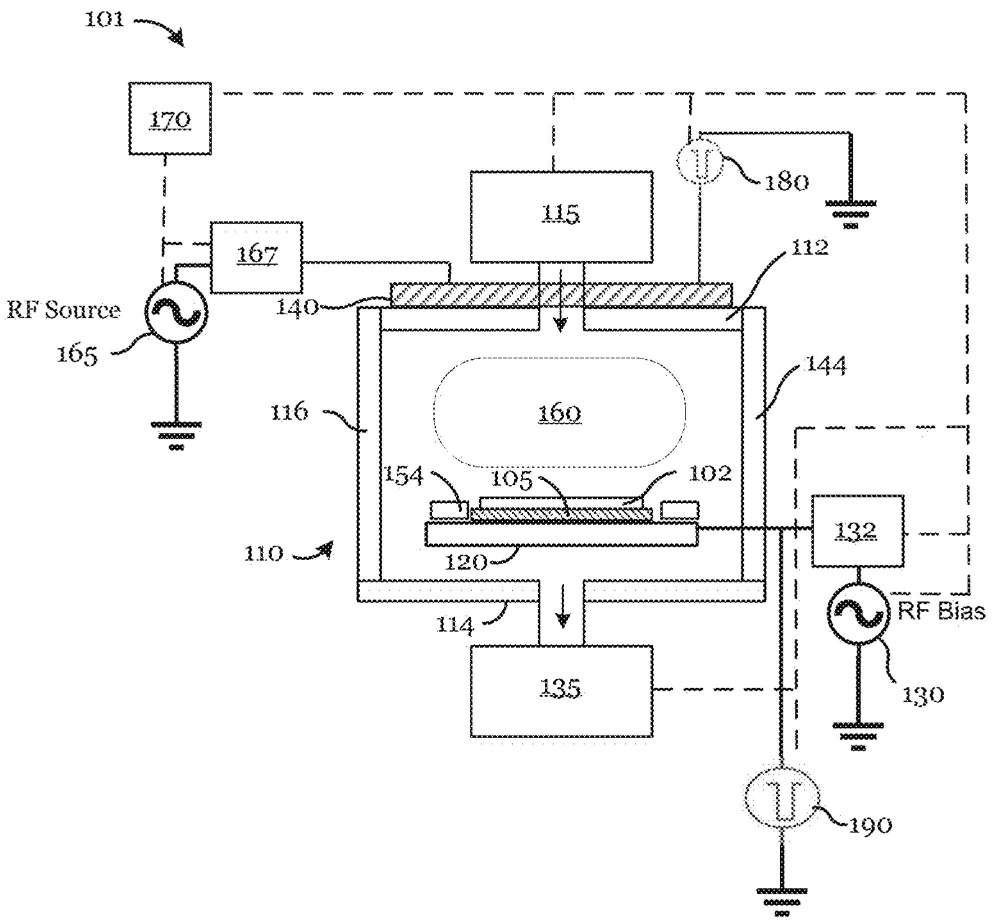
FIG. 4B illustrates another example plasma processing system, in accordance with some embodiments.

FIG. 4B illustrates another example plasma processing system 101 used for capacitively coupled plasma (CCP), in accordance with some embodiments. The plasma processing system 101 may comprise similar components in similar configurations as described above for the plasma processing system 100 with respect to FIG. 4A, and the details are not repeated herein. In some embodiments, a boundary electrode 140 is located above the plasma processing chamber 110, such as above or on the top plate 112. In other embodiments, the boundary electrode 140 is located inside the plasma processing chamber 110, such as under the top plate 112. In various embodiments, the boundary electrode 140 is a conductive plate electrode used to capacitively ignite and couple power to a plasma 160 inside the plasma processing chamber 110. However, any suitable boundary electrode 140 may be used. The boundary electrode 140 may be coupled to the radio frequency (RF) source 165 via the matching circuit 167.

A DC power source 180 is coupled to the boundary electrode 140 in order to provide bias voltage to the top of the plasma processing chamber 110. In various embodiments, the controller 170 is coupled with the DC power source 180 and is programmed to perform an etching step by, for example, ramping a sheath voltage of the plasma 160 applied to the top of the plasma process chamber 110 from the DC power source 180.

The configurations of the plasma etching systems described above with respect to FIGS. 4A and 4B are for example only. In alternative embodiments, various alternative configurations may be used for a plasma processing system that incorporates a set of electromagnets. For example, the plasma processing system may be a resonator such as a helical resonator that produces helicons. Further, microwave plasma (MW), electron cyclotron resonance (ECR), multi-frequency CCP, or other suitable systems may be used. In various embodiments, the RF power, chamber pressure, substrate temperature, gas flow rates and other plasma process parameters may be selected in accordance with the respective process recipe.

In addition, embodiments of the present invention may be also applied to remote plasma systems as well as batch systems. For example, the substrate holder may be able to support a plurality of wafers that are spun around a central axis as they pass through different plasma zones. Accordingly, it is possible to have multiple plasma zones, for example, including a metal-containing plasma zone, metal-free plasma zone, and plasma-free zone (e.g., a purge zone).

Figure 5A:
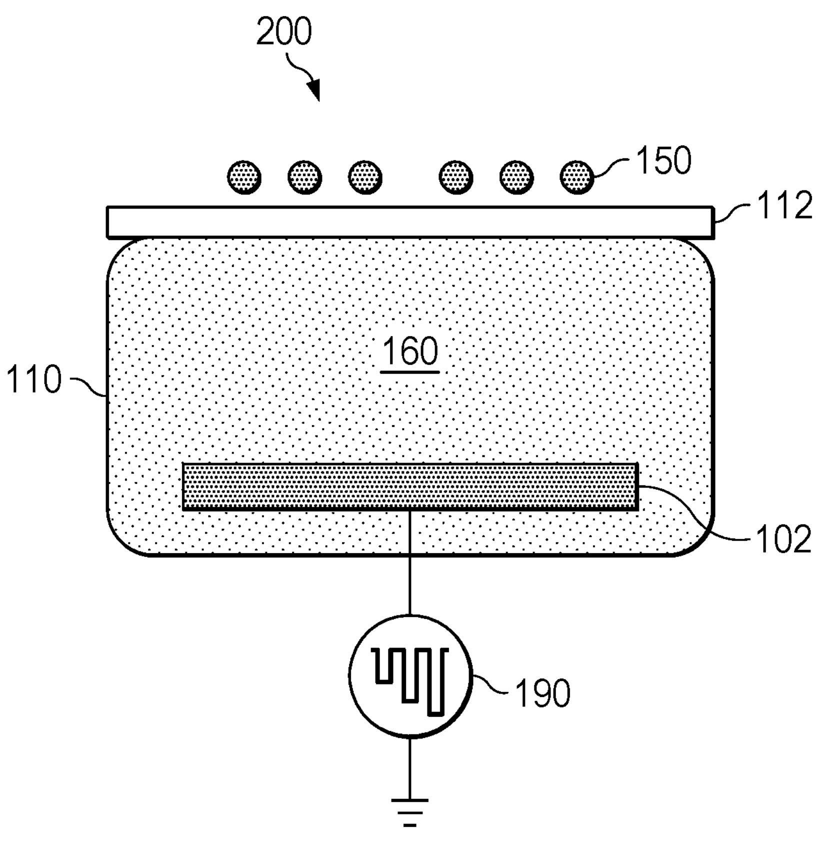
FIGS. 5A and 5B illustrate a system and method for plasma processing, in accordance with some embodiments.
Figure 5B:
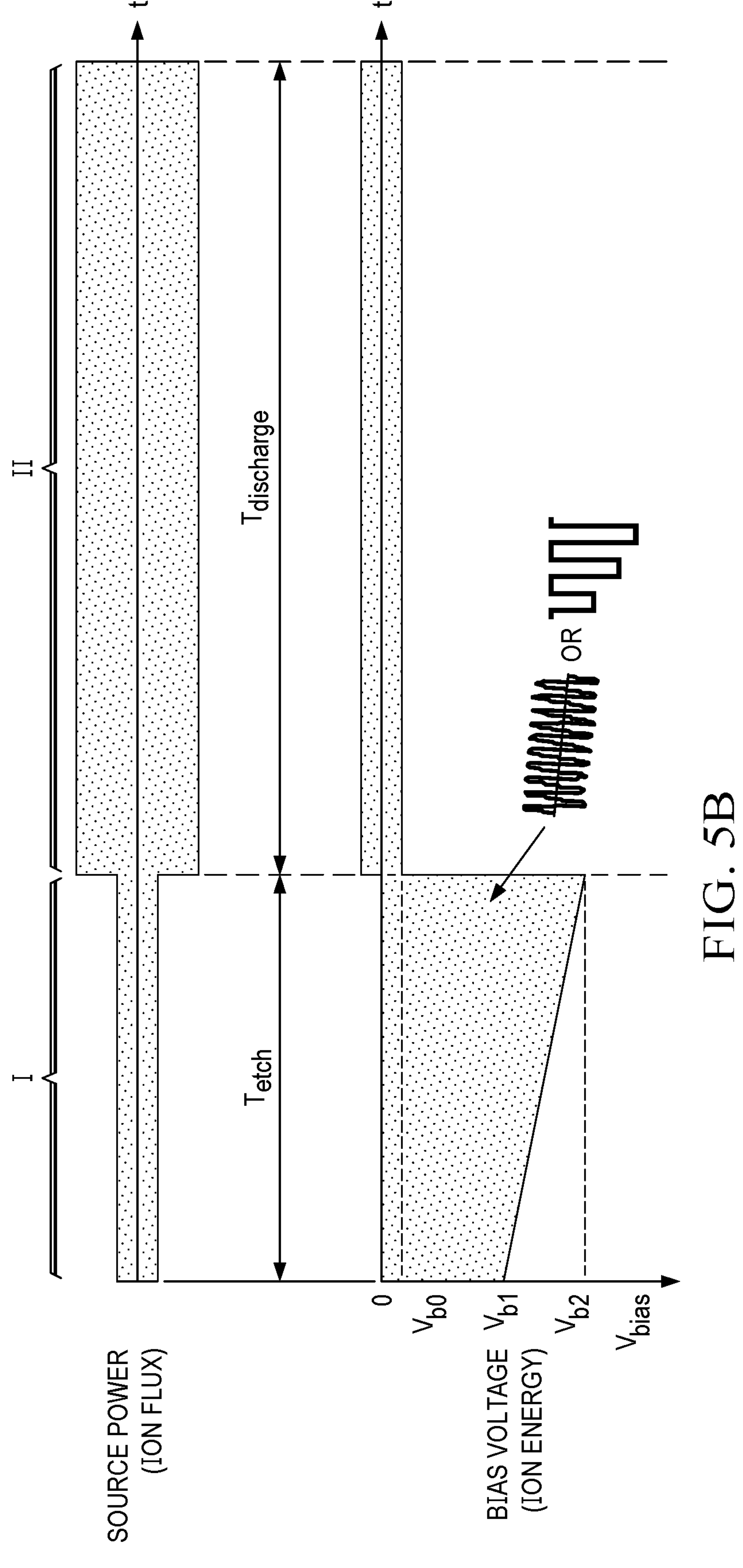

FIGS. 5A and 5B illustrate a system and method for plasma processing performed with a tailored bias voltage waveform, in accordance with some embodiments. FIG. 5A illustrates a plasma processing system 200 (also referred to as an etch processing system) with the capability of applying a tailored bias voltage waveform to a substrate 102 with high aspect ratio (HAR) features exposed to a plasma 160. The plasma processing system 200 may be an inductively coupled plasma (ICP) processing system similar to the example plasma processing system 100 described above with respect to FIG. 4A, and details are not repeated herein.

FIG. 5B illustrates source power and bias voltage for the method for plasma processing (such as an etch process). The method for plasma processing comprises two steps, step I and step II. In step I, also referred to as an etch step, plasma source power is kept low to moderate, such as in a range of 50 W to 2000 W, or a range of 5% to 80% of the maximum possible plasma source power providable by the system, and the tailored bias voltage $V_{bias}$ is increased from a voltage $V_{b1}$ to a voltage $V_{b2}$. Both voltages $V_{b1}$ and $V_{b2}$ within are within the process window as illustrated by FIG. 5B. In some embodiments, voltage $V_{b1}$ is in a range of 20 V to 20,000 V, such as a range of 100 V to 200 V, and voltage $V_{b2}$ is in a range of 20 V to 20,000 V, such as a range of 150 V to 250 V. The voltages $V_{b1}$ and $V_{b2}$ may be determined to maintain selectivity to a mask material during an etch process.

The etch step duration $T_{etch}$ of step I may depend on the desired ion energy range of the process window and the desired slew rate to maintain sufficient ion transport within the high aspect ratio (HAR) features (in other words, to bombard the features with ions from the plasma). Due to potentially long time scales of high aspect ratio (HAR) feature sidewall charging, the etch step duration $T_{etch}$ is may be comparatively long. For example, in various embodiments the etch step duration $T_{etch}$ is in a range of 0.1 ms to 100 s.

The tailored bias voltage slew rate of the bias voltage waveform is computed as $dV/dt=(V_{b2}-V_{b1})/T_{etch}$. In various embodiments, the tailored bias voltage slew rate dV/dt is in a range of 0.01 V/ms to 1000 V/ms, such as 1 V/ms to 100 V/ms. The bias voltage waveform applied to the substrate 102 may be sinusoidal, rectangular, saw-shaped, or any other suitable voltage waveform.

It is expected that even with the tailored bias voltage applied, the high aspect ratio (HAR) feature sidewalls may reach charge saturation. As such, it is desirable to perform step II, also referred to as a charge neutralization step. During step II, the plasma source power can be set at a relatively high value, for example in a range of 100 W to 10000 W. This may be advantageous for producing sufficient electrons for neutralization of accumulated charge on high aspect ratio (HAR) feature sidewalls. In some embodiments, the substrate bias voltage is set at a small negative voltage $-V_{b0}$ or at zero (where $-V_{b0}$ is in a range of 0 V to −300 V, such as −50 V or less) that is less than a mask etching threshold to avoid undesirable mask erosion. The duration of step II, $T_{discharge}$, is chosen such that HAR feature sidewalls are nearly or completely discharged. In various embodiments, the discharge step duration $T_{discharge}$ is in a range of 0.1 ms to 100 s. This may be advantageous by allowing the etch process to continue by repeating step I with a ramping tailored bias voltage, which may be subsequently followed by a repetition of step II for as many cycles as is suitable. In some embodiments, the charge elimination step uses a same etch chemistry as the etch step. In other embodiments, the charge reduction step uses nonreactive gases, such as noble gases He, Ar, Kr, Xe, the like, or a combination thereof, which may be advantageous for increasing electron current. In still other embodiments, source power during step II remains the same as in step I.

Figure 6A:
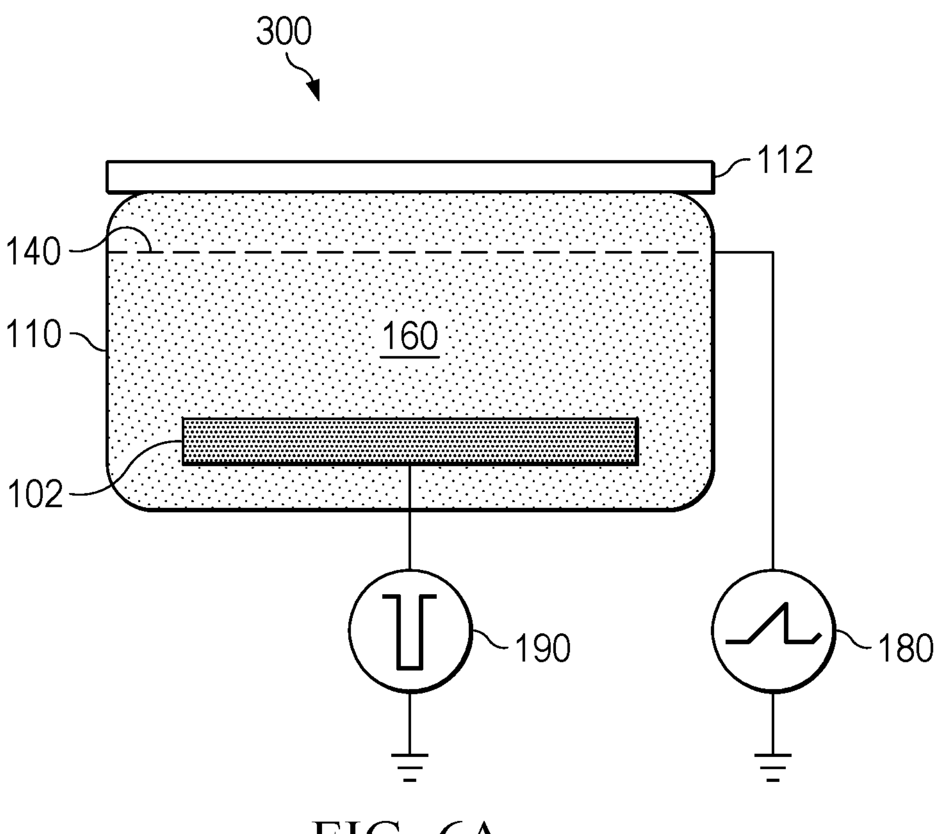

FIGS. 6A and 6B illustrate another system and method for plasma processing performed with a tailored bias voltage waveform, in accordance with some embodiments. FIG. 6A illustrates another embodiment of a plasma processing system 300 with the capability of applying a tailored voltage waveform from a DC power source 180 (such as a variable DC power source) to a boundary electrode 140 at or near the top of a plasma processing chamber 110. Although FIG. 6A illustrates the DC power source 180 being coupled to a top interior region of the plasma processing chamber 110, the DC power source 180 may also be coupled to the boundary electrode 140. The plasma processing system 300 may be a capacitively coupled plasma (CCP) processing system similar to the example plasma processing system 101 described above with respect to FIG. 4B, and details are not repeated herein. In some embodiments, the tailored voltage waveform is applied to the boundary electrode 140 in combination with application of a tailored bias voltage waveform (such as from a pulse DC power source 190) to the substrate 102. In other embodiments, the tailored voltage waveform is applied to the boundary electrode 140 without application of a tailored bias voltage waveform to the substrate 102, such as the application of a flat (non-ramped) bias voltage waveform as illustrated in FIG. 6B.

As illustrated in FIG. 6B, similar process steps and process parameters may be used as are described above with respect to FIG. 5B. In other words, a step I (or etch step) may be performed and followed by a step II (or charge neutralization step). During step I, the tailored voltage waveform applied to the boundary electrode 140 may be a triangular or sawtooth, DC or low-frequency sinusoidal (such as in a range of 0.01 Hz to 100 Hz) waveform. The tailored voltage waveform applied to the boundary electrode 140 increase from a voltage $V_{DC1}$ to a voltage $V_{DC2}$ for the etch step duration $T_{etch}$, where $V_{DC1}$ and $V_{DC2}$ are boundary electrode voltages within the process window. The boundary electrode voltage slew rate is thus $dV/dt=(V_{DC2}-V_{DC1})/T_{etch}$. The tailored voltage waveform applied to the boundary electrode 140 causes a ramping plasma potential $V_p$ during the etch step, which in turn causes a ramping sheath voltage $V_{sh}$ and increasing ion energy. During the etch step, the plasma source power is maintained at a low to moderate level, such as 80% or less (e.g., in a range of 5% to 80%) of the maximum possible plasma source power providable by the system. The effects of application of a ramping voltage to the boundary electrode 140 may be similar to the effects of application of a ramping bias voltage to the substrate 102, as described above with respect to FIGS. 5A-5B.

Step I (the etch step) is followed by a step II (a charge neutralization step) with high plasma source power, such as greater than 80% of maximum possible plasma source power providable by the system (e.g., in a range of 100 W to 10000 W), and zero or low bias voltage. This may facilitate charge neutralization by electrons inside high aspect ratio (HAR) features. During step II, the plasma potential $V_p$ falls at a rate proportionate to the ratio of the ion current ji to a capacitance $C_{chamber}$ wall of the dielectric coated chamber walls of the plasma processing chamber 110. After the charge neutralization step, the etch process may be continued by repeating step I, which may be subsequently followed by a repetition of step II for as many cycles as is suitable.

In the respective embodiments of FIGS. 5A-5B and 6A-6B, the voltage differences $V_{b2}-V_{b1}$ and $V_{DC2}-V_{DC1}$ may be expressed as a percentage (or fraction) of the recommended process windows $(V_{b2}+V_{b1})/2$ and $(V_{DC2}+V_{DC1})/2$, respectively. In various embodiments, the percentages of the voltage differences with respect to the recommended process values are in a range of 1% to 1000%, such as 20%.

Figure 7A:
FIGS. 7A-7D illustrate cross-sectional views of a semiconductor structure during intermediate stages of manufacturing, in accordance with some embodiments.
Figure 7A:
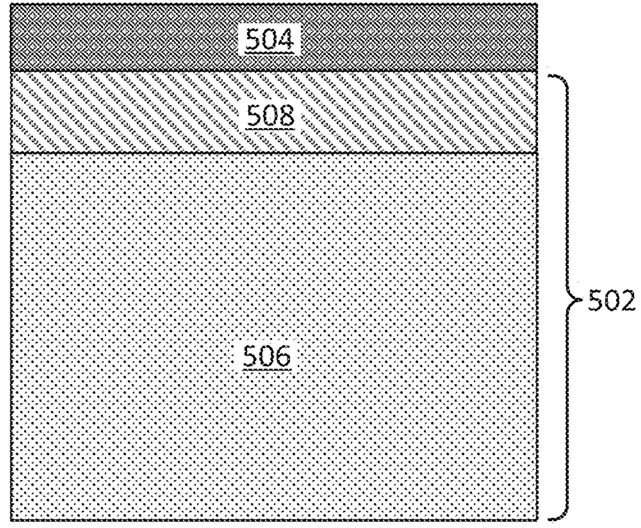
Figure 7B:
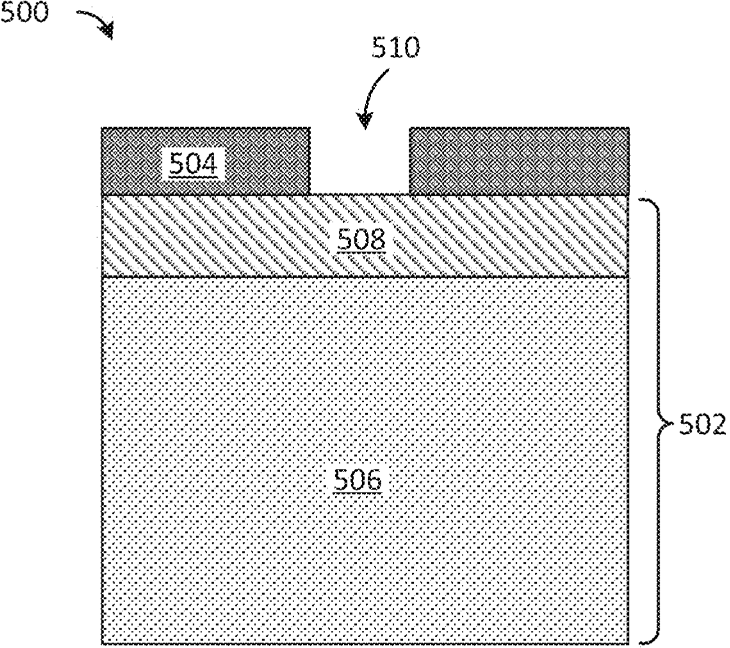
Figure 7C:
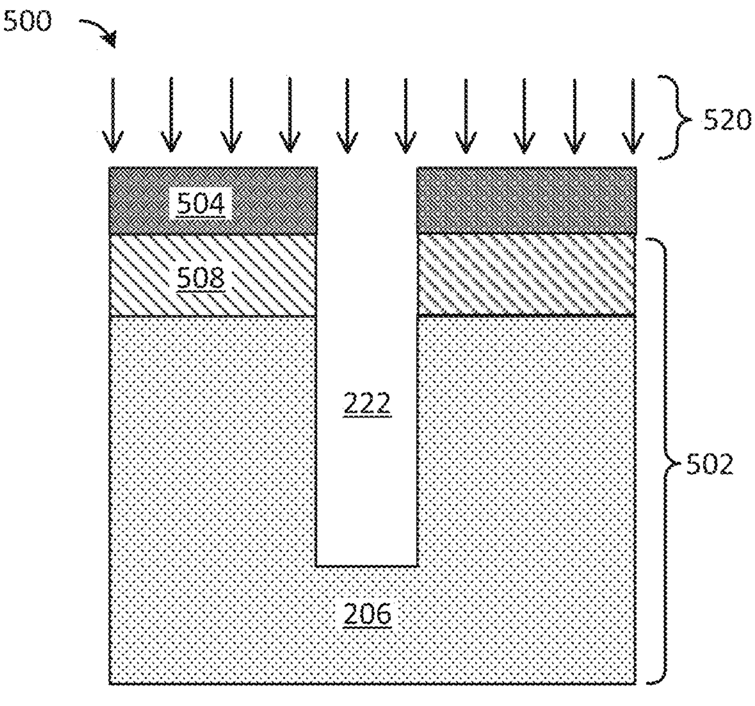
Figure 7D:
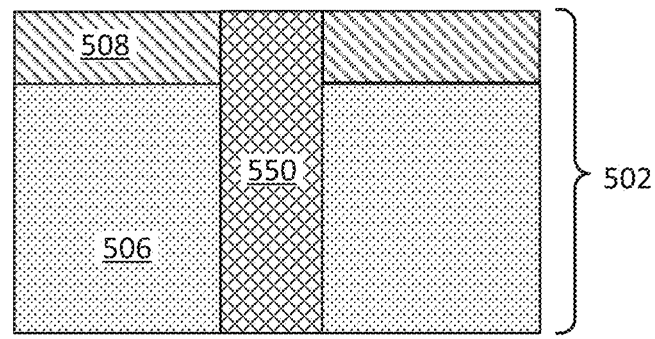

FIGS. 7A-7D illustrate an example process for processing a substrate, in accordance with some embodiments. FIGS. 7A-7C illustrate cross sectional views of a semiconductor structure 500 illustrating the formation of a high aspect ratio opening in a substrate 502, and FIG. 7D illustrates the formation of a conductive feature in the high aspect ratio opening. High aspect ratio openings (e.g., openings with aspect ratios greater than 10:1, such as greater than 20:1 or greater than 50:1) can be trenches or holes with rectangular, square, circular (as in contacts) or any other regular or irregular shapes.

In some embodiments, the substrate 502 comprises a semiconductor substrate 506 such as a semiconductor wafer with an overlying dielectric layer 508. In some embodiments, the semiconductor substrate 506 is a silicon wafer, or a silicon-on-insulator (SOI) wafer. In certain embodiments, the semiconductor substrate 506 comprises a silicon germanium wafer, silicon carbide wafer, gallium arsenide wafer, gallium nitride wafer and other compound semiconductors. In other embodiments, the semiconductor substrate 506 comprises heterogeneous layers such as silicon germanium on silicon, gallium nitride on silicon, silicon carbon on silicon, as well layers of silicon on a silicon or SOI substrate. In an embodiment, the semiconductor substrate 506 is a single crystal semiconductor substrate such as a single crystal silicon wafer or a silicon-on-insulator substrate.

In various embodiments, the semiconductor structure 500 is patterned or embedded in other components of a semiconductor device. In various embodiments, the substrate 502 may be a part of a semiconductor device, and may have undergone a number of steps of processing following, for example, a conventional process. The substrate 502 accordingly may comprise layers of semiconductors useful in various microelectronics. For example, the semiconductor structure 500 may comprise a dielectric layer 508 (also referred to as a back end of line (BEOL) layer) in which various device regions are formed. The dielectric layer 508 may comprise silicon oxide, silicon dioxide, the like, or a combination thereof.

A photomask layer 504 is deposited on the substrate 502. In some embodiments, the photomask layer 504 is a trilayer photomask with a bottom organic (ODL) layer, a middle antireflective coat layer, and a top photoresist layer. However, any suitable photomask may be used for the photomask layer 504.

In FIG. 7B, a first opening 510 is formed in the photomask layer 504 using conventional photolithography techniques. As an example, the photomask layer 504 is exposed to a light pattern, such as an ultraviolet (UV), a far ultraviolet (FUV), or an extreme ultraviolet (EUV) exposure. A photomask may be used to create a light pattern by placing the photomask between the substrate 502 and a light source (not illustrated). In response to the exposure to the light pattern, a photoreaction may occur in exposed regions of the photomask layer 504, while unexposed regions remain unchanged. As a result of the photoreaction, the exposed regions may comprise a cross-linked photoresist film, which may have material properties substantially different from the unreacted portion of the photomask layer 504. Such a difference in the material properties includes volatility, reactivity, and/or solubility among others, which gives origin to the tonality as a photoresist.

Next, after exposure to the light pattern, a development process is performed on the substrate 502 with a reactive precursor. In some embodiments, the development process is a plasma-less process performed with a gaseous (non-ionized) reactive precursor (also referred to as a developing gas). The reactive precursor reacts with, e.g., the unexposed regions of the photomask layer 504 to produce volatile by-products, which then evaporate from the surface of the substrate 502 to form a first opening 510. This reaction develops the photomask layer 504. In some embodiments, the reactive precursor is a reactive gas such as hydrogen bromide (HBr), hydrogen chloride (HCl), boron trichloride ($BCl_3$), organic acids such carboxylic acids, methanol, ethanol, isopropyl alcohol, the like, or a mixture or combination thereof.

Next, in FIG. 7C, the first opening 210 is etched through the dielectric layer 508 with a plasma process 520 to form a high aspect ratio (HAR) second opening 522, in accordance with some embodiments. The plasma process 520 may be performed in an example plasma processing system 100 or 101 as described above with respect to FIGS. 4A and 4B, respectively. For example, the semiconductor structure 500 may be provided into the example plasma processing system 100 and being placed on the substrate holder 105 (such as in the place of the substrate 102; see above, FIG. 4A).

The plasma process 520 includes a source phase with a source power pulse and a bias phase with a bias power pulse. In various embodiments, the bias power pulse follows the source power pulse and the source power pulse and bias power pulse do not overlap. In some embodiments, the bias phase (also referred to as a bias step) includes ramping a bias voltage applied to the substrate holder 105, as described above with respect to FIGS. 5A-5B. In other embodiments, the bias phase includes ramping a sheath voltage of the plasma by providing a DC voltage to a boundary electrode located at a top of the plasma processing chamber in which the plasma process 520 is being performed, as described above with respect to FIGS. 6A-6B. In still other embodiments, the bias phase includes both ramping the bias voltage applied to the substrate holder 105 and ramping the sheath voltage of the plasma by providing a DC voltage to the boundary electrode. This may be advantageous by minimizing ions repelled by electric fields induced by accumulated charge on surfaces of the second opening 522. The source power phase includes increasing a density of the plasma with a source power pulse, which may thereby discharge surface charge accumulated on surfaces of the second opening 522 as described above with respect to FIGS. 5A-5B and 6A-6B. The source phase and bias phase may be repeated for any suitable number of cycles in order to form the second opening 522 to a desired depth.

In some embodiments, the plasma process 520 etches the high aspect ratio second opening 522 into the semiconductor substrate 506, such as to a depth in a range of 10 μm to 100 μm. In other embodiments, the high aspect ratio second opening 522 stops on the semiconductor substrate 506. The high aspect ratio second opening 522 can be rectangular, square, circular (as in contacts) or any other regular or irregular shape and may be formed like a trench or hole in various embodiments. In some embodiments, the plasma process 520 is performed for a duration in a range of 0.1 minutes to 100 minutes.

In FIG. 7D, a conductive feature 550 is formed in the high aspect ratio (HAR) second opening 522 (see above, FIG. 7C). In various embodiments, the conductive feature 550 is a high aspect ratio feature (e.g., a conductive via or through substrate via (TSV)). The conductive feature 550 may be formed to physically and electrically couple with conductive portions of the substrate 502, such as conductive features in the dielectric layer 508. As an example of forming the conductive feature 550, a conformal barrier metal (e.g., TiN or TaN) liner is formed over the exposed surfaces of the dielectric layer 508 and the semiconductor substrate 506. Next, the high aspect ratio second opening 522 is filled with a conductive material such as a metal. For example, the conductive material may be copper formed using electroplating. However, any suitable conductive material and deposition method may be used. Excess conductive material is then removed from the top surface of the dielectric layer 508 using a planarization process (e.g., a CMP), thereby forming the conductive feature 550 inlaid in the substrate 202.

In some embodiments, after forming the conductive feature 550, a bottom surface of the semiconductor substrate 506 is recessed to expose a respective bottom surface of the conductive feature 550. For example, the semiconductor structure 500 may be flipped over and placed on a carrier. The semiconductor substrate 506 is then recessed to expose the conductive feature 550 with a suitable process, such as a wafer backgrinding. However, any suitable method may be used to expose a respective bottom surface of the conductive feature 550.

Although FIGS. 7A-7D illustrate the formation of a single high aspect ratio second opening 522 with a plasma process 520 and a single conductive feature 550 being formed in the high aspect ratio second opening 522, it should be understood that this is disclosed as a non-limiting example. Any suitable number of high aspect ratio second openings 522 may be formed with one or more plasma processes 520 and be filled with respective conductive features 550 in order to form, for example, a via array, and all such methods and structures are within the scope of the disclosed embodiments.

Figure 8:
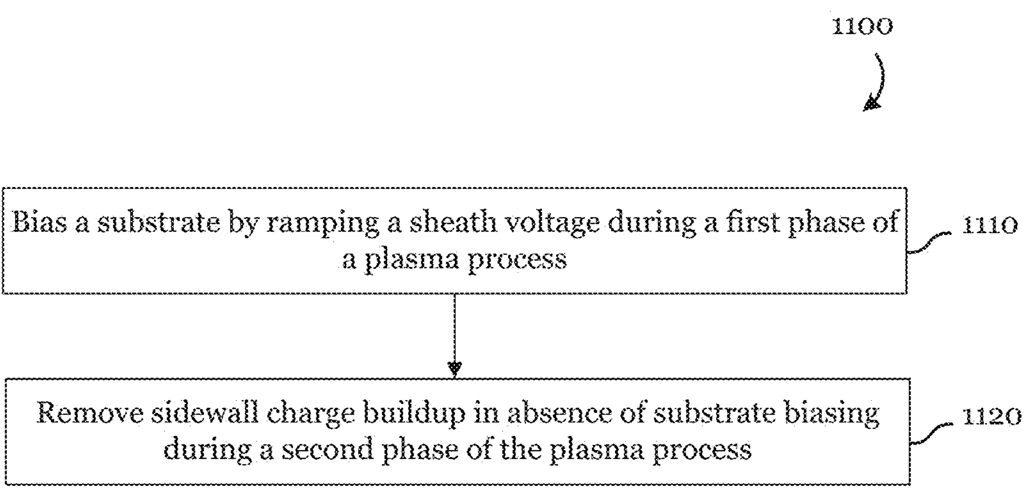
FIG. 8 illustrates a process flow chart diagram of a method for plasma processing, in accordance with some embodiments.

FIG. 8 illustrates a process flow chart diagram of a method 1102 for plasma processing, in accordance with some embodiments. In step 1110, a substrate is biased by ramping a sheath voltage during a first phase of a plasma process, as described above with respect to FIGS. 5A-5B. In step 1120, sidewall charge buildup on a feature of the substrate is removed in an absence of substrate biasing during a second phase of the plasma process, as described above with respect to FIGS. 5A-5B.

Figure 9:
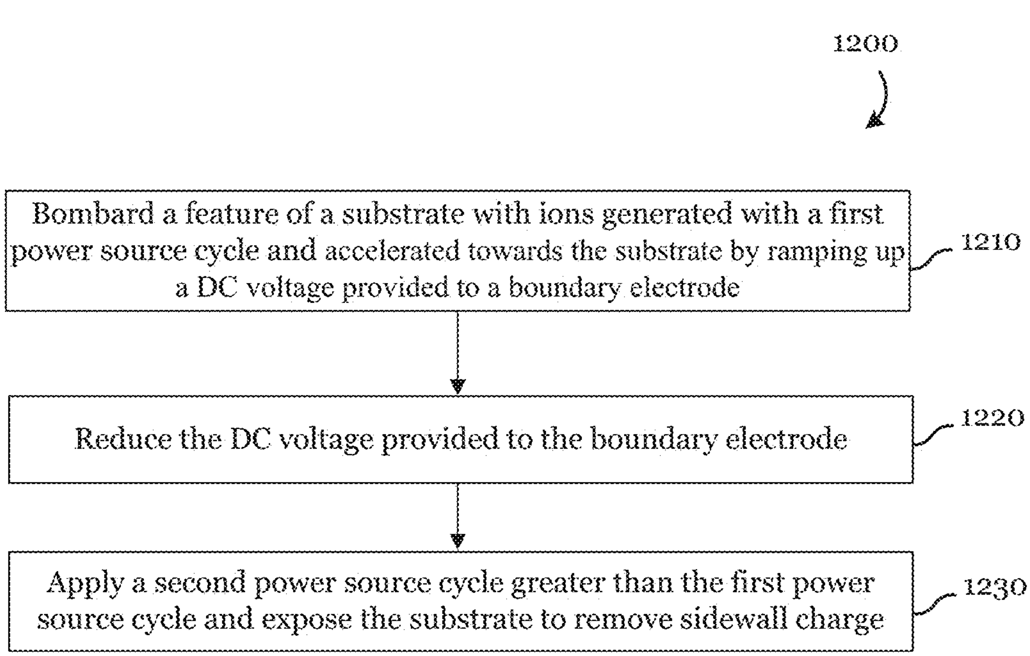
FIG. 9 illustrates a process flow chart diagram of a method for plasma processing, in accordance with some embodiments.

FIG. 9 illustrates a process flow chart diagram of a method 1200 for plasma processing, in accordance with some embodiments. In step 1210, a feature of a substrate is bombarded with ions from a first plasma generated with a first source power cycle from a power source, as described above with respect to FIGS. 6A-6B. The ions are accelerated towards the substrate by ramping up a DC voltage provided to a boundary electrode above the substrate. In step 1220, the DC voltage provided to the boundary electrode is reduced to lower the acceleration of the ions towards the substrate, as described above with respect to FIGS. 6A-6B. In step 1230, a second source power cycle from the power source is applied to generate a second plasma and expose the substrate to the second plasma to remove sidewall charge on a feature of the substrate, the second source power cycle being greater than the first source power cycle, as described above with respect to FIGS. 6A-6B.

Figure 10:
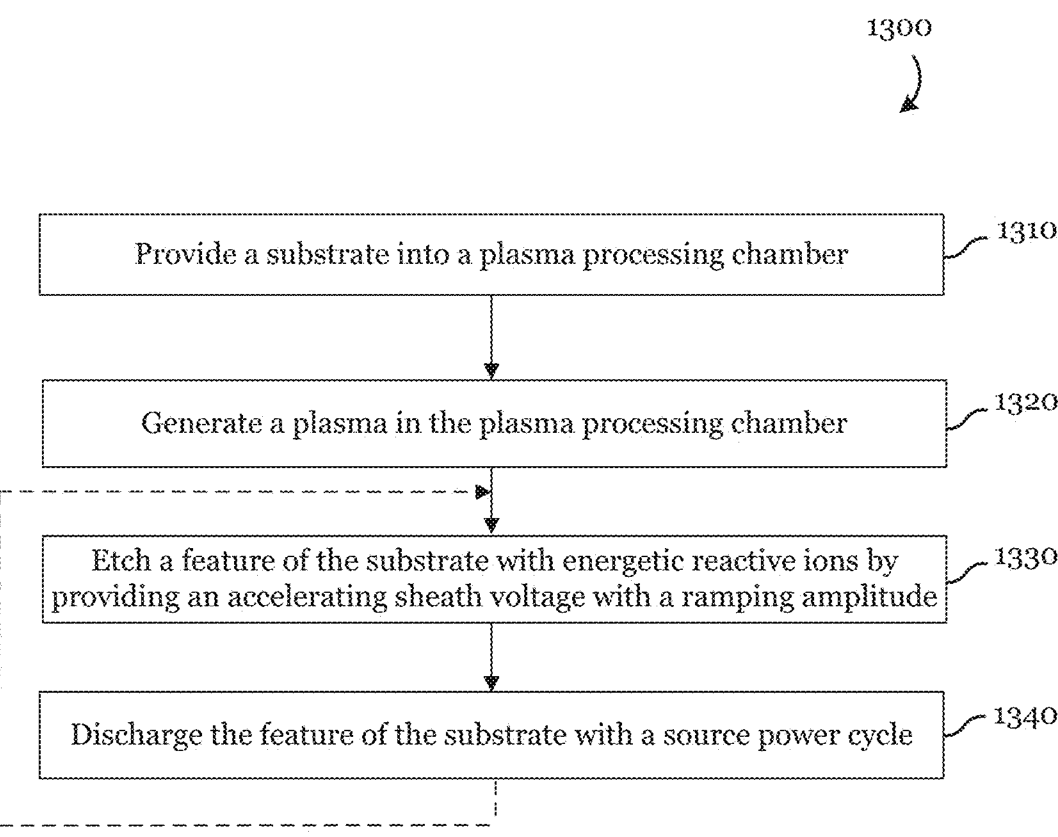
FIG. 10 illustrates a process flow chart diagram of a method for an etch process, in accordance with some embodiments.

FIG. 10 illustrates a process flow chart diagram of a method 1300 for an etch process, in accordance with some embodiments. In step 1310, a substrate is provided into a plasma processing chamber, as described above with respect to FIGS. 4 and 7C. In step 1320, a plasma is generated in the plasma processing chamber, as described above with respect to FIG. 4A. In step 1330, a feature of the substrate is etched with energetic reactive ions by providing an accelerating sheath voltage with a ramping amplitude, as described above with respect to FIG. 7C. In step 1340, the feature of the substrate is discharged with a source power cycle (also referred to as a source power period) provided to the plasma processing chamber, as described above with respect to FIG. 7C. Steps 1320 and 1330 may be repeated for any suitable number of cycles.

Example embodiments of the disclosure are summarized here. Other embodiments can also be understood from the entirety of the specification as well as the claims filed herein.

Example 1. A method for plasma processing, the method including: biasing a substrate by ramping a sheath voltage during a first phase of a plasma process; and removing sidewall charge buildup on a feature of the substrate in an absence of substrate biasing during a second phase of the plasma process.

Example 2. The method of example 1, where source power is higher during the second phase than during the first phase.

Example 3. The method of example 1, where source power is the same during the second phase as during the first phase.

Example 4. The method of one of examples 1 to 3, where the second phase of the plasma process includes using a different process chemistry from the first phase of the plasma process.

Example 5. The method of one of examples 1 to 4, where the sheath voltage is ramped with a slew rate in a range of 1 V/ms to 100 V/ms.

Example 6. The method of one of examples 1 to 5, where the sheath voltage has a sinusoidal waveform while being ramped.

Example 7. The method of one of examples 1 to 5, where the sheath voltage has a rectangular waveform while being ramped.

Example 8. The method of one of examples 1 to 5, where the sheath voltage has a sawtooth waveform while being ramped.

Example 9. A method for plasma processing, the method including: bombarding a feature of a substrate with ions from a first plasma generated with a first source power cycle from a power source, the ions being accelerated towards the substrate by ramping up a DC voltage provided to a boundary electrode above the substrate; reducing the DC voltage provided to the boundary electrode to lower the acceleration of the ions towards the substrate; and applying a second source power cycle from the power source to generate a second plasma and exposing the substrate to the second plasma to remove sidewall charge on a feature of the substrate, the second source power cycle being greater than the first source power cycle.

Example 10. The method of example 9, where the DC voltage provided to the boundary electrode is a sinusoidal waveform with a frequency in a range of 0.01 Hz to 100 Hz.

Example 11. The method of one of examples 9 or 10, where the first source power cycle is 80% or less of the maximum source power providable by the power source.

Example 12. The method of one of examples 9 to 11, where the second source power cycle is greater than 80% of the maximum source power providable by the power source.

Example 13. The method of one of examples 9 to 12, further including providing a bias voltage to the substrate while ramping the DC voltage provided to the boundary electrode.

Example 14. The method of one of examples 9 to 13, where a duration of ramping the DC voltage provided to the boundary electrode is in a range of 0.1 ms to 100 s.

Example 15. A method for an etch process, the method including: providing a substrate into a plasma processing chamber; generating a plasma in the plasma processing chamber; etching a feature of the substrate with energetic reactive ions by providing an accelerating sheath voltage with a ramping amplitude; and discharging the feature of the substrate with a source power cycle provided to the plasma processing chamber.

Example 16. The method of example 15, where the sheath voltage is reduced while discharging the feature of the substrate.

Example 17. The method of one of examples 15 or 16, where providing the accelerating sheath voltage includes providing a bias voltage to a substrate holder of the plasma processing chamber, the substrate being disposed on the substrate holder.

Example 18. The method of one of examples 15 to 17, where providing the accelerating sheath voltage includes providing a bias voltage to a boundary electrode of the plasma processing chamber, the boundary electrode being over the substrate.

Example 19. The method of one of examples 15 to 18, where discharging the feature of the substrate is performed with a noble gas.

Example 20. The method of one of examples 15 to 19, where the sheath voltage is ramped at a rate in a range of 0.01 V/ms to 1000 V/ms.

Example 21. A method for plasma processing, the method including: bombarding a feature of a substrate with ions by ramping a sheath voltage of a plasma, the plasma being at a first density; decrease energy of the bombarding ions by decreasing bias; and removing excessive sidewall charge on the feature of the substrate by applying plasma at a second density, the second density being greater than the first density.

Example 22. The method of example 21, where ramping the sheath voltage of the plasma includes providing a DC voltage to a boundary electrode, the boundary electrode being above the substrate.

Example 23. The method of example 22, where the DC voltage provided to the boundary electrode is a sinusoidal waveform with a frequency in a range of 0.01 Hz to 100 Hz.

Example 24. The method of one of examples 21 to 23, where applying the plasma at the second density includes providing a source power pulse to the plasma.

Example 25. The method of one of examples 21 to 24, further including providing a bias voltage to the substrate while ramping the sheath voltage of the plasma.

Example 26. The method of one of examples 21 to 25, where a duration of ramping the sheath voltage of the plasma is in a range of 0.1 ms to 100 s.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for plasma processing, the method comprising:

biasing a substrate by applying a bias voltage to a substrate holder or boundary electrode of a plasma processing chamber to ramp a sheath voltage during a first phase of a plasma process; and exposing a feature to a plasma in an absence of substrate biasing during a second phase of the plasma process to remove sidewall charge buildup on the feature of the substrate, wherein the second phase of the plasma process comprises using a different process chemistry from the first phase of the plasma process.

2. The method of claim 1, wherein source power is higher during the second phase than during the first phase.

3. The method of claim 1, wherein source power is the same during the second phase as during the first phase.

4. The method of claim 1, wherein the sheath voltage is ramped with a slew rate in a range of 1 V/ms to 100 V/ms.

5. The method of claim 1, wherein the sheath voltage has a sinusoidal waveform while being ramped.

6. The method of claim 1, wherein the sheath voltage has a rectangular waveform while being ramped.

7. The method of claim 1, wherein the sheath voltage has a sawtooth waveform while being ramped.

8. A method for plasma processing, the method comprising:

bombarding a feature of a substrate with ions from a first plasma generated with a first source power cycle from a power source, the ions being accelerated towards the substrate by ramping up a DC voltage provided to a boundary electrode above the substrate;

reducing the DC voltage provided to the boundary electrode to lower the acceleration of the ions towards the substrate; and applying a second source power cycle from the power source to generate a second plasma and exposing the substrate to the second plasma to remove sidewall charge on a feature of the substrate, the second source power cycle having a greater power level than the first source power cycle.

9. The method of claim 8, wherein the DC voltage provided to the boundary electrode is a sinusoidal waveform with a frequency in a range of 0.01 Hz to 100 Hz.

10. The method of claim 8, wherein the first source power cycle is 80% or less of the maximum source power providable by the power source.

11. The method of claim 8, wherein the second source power cycle is greater than 80% of the maximum source power providable by the power source.

12. The method of claim 8, further comprising providing a bias voltage to the substrate while ramping the DC voltage provided to the boundary electrode.

13. The method of claim 8, wherein a duration of ramping the DC voltage provided to the boundary electrode is in a range of 0.1 ms to 100 s.

14. A method for an etch process, the method comprising:

providing a substrate into a plasma processing chamber;

generating a plasma in the plasma processing chamber;

etching a feature of the substrate with energetic reactive ions by applying a bias voltage to a substrate holder or boundary electrode of the plasma processing chamber to produce an accelerating sheath voltage with a ramping amplitude, wherein the sheath voltage has a sinusoidal, rectangular, or sawtooth waveform; and discharging the feature of the substrate with a source power cycle provided to the plasma processing chamber.

15. The method of claim 14, wherein the sheath voltage is reduced relative to the sheath voltage during the etching while discharging the feature of the substrate.

16. The method of claim 14, wherein providing the accelerating sheath voltage comprises providing a bias voltage to a substrate holder of the plasma processing chamber, the substrate being disposed on the substrate holder.

17. The method of claim 14, wherein providing the accelerating sheath voltage comprises providing a bias voltage to a boundary electrode of the plasma processing chamber, the boundary electrode being over the substrate.

18. The method of claim 14, wherein discharging the feature of the substrate is performed with a noble gas.

19. The method of claim 14, wherein the sheath voltage is ramped at a rate in a range of 0.01 V/ms to 1000 V/ms.

* * * * *